United States Patent
Kong et al.

(10) Patent No.: US 6,797,312 B2
(45) Date of Patent: Sep. 28, 2004

(54) ELECTROLESS PLATING SOLUTION AND PROCESS

(75) Inventors: Bob Kong, Newark, CA (US); Nanhai Li, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 10/348,612

(22) Filed: Jan. 21, 2003

(65) Prior Publication Data

US 2004/0142114 A1 Jul. 22, 2004

(51) Int. Cl.$^7$ .............................. B05D 5/12; B05D 1/18
(52) U.S. Cl. .................... 427/58; 427/123; 427/304; 427/305; 427/437; 427/438
(58) Field of Search .................. 427/58, 123, 304, 427/305, 437, 438

(56) References Cited

U.S. PATENT DOCUMENTS

| | | | |
|---|---|---|---|
| 3,971,861 A | | 7/1976 | de Waltoff |
| 4,171,393 A | | 10/1979 | Donley et al. |
| 4,259,409 A | | 3/1981 | Arnold |
| 4,659,587 A | | 4/1987 | Imura |
| 4,664,942 A | | 5/1987 | Park |
| 4,701,351 A | | 10/1987 | Jackson |
| 4,720,404 A | * | 1/1988 | Culjkovic ............. 427/98 |
| 4,981,715 A | | 1/1991 | Hirsch et al. |
| 5,077,085 A | | 12/1991 | Schnur et al. |
| 5,079,600 A | | 1/1992 | Schnur et al. |
| 5,130,081 A | | 7/1992 | Niedrach |
| 5,230,928 A | | 7/1993 | Takagi |
| 5,232,744 A | * | 8/1993 | Nakamura et al. ........ 427/437 |
| 5,292,558 A | | 3/1994 | Heller et al. |
| 5,500,315 A | | 3/1996 | Calvert et al. |
| 5,510,216 A | | 4/1996 | Calabrese et al. |
| 5,674,787 A | | 10/1997 | Zhao et al. |
| 5,695,810 A | | 12/1997 | Dubin et al. |
| 5,814,197 A | | 9/1998 | Batchelder et al. |
| 5,824,599 A | | 10/1998 | Schacham-Diamand et al. |
| 5,830,805 A | | 11/1998 | Shacham-Diamand et al. |
| 5,846,598 A | | 12/1998 | Semkow et al. |
| 5,869,134 A | | 2/1999 | Reddy et al. |
| 5,891,513 A | | 4/1999 | Dubin et al. |
| 5,935,652 A | | 8/1999 | Angelopoulos et al. |
| 5,993,892 A | | 11/1999 | Wasserman et al. |
| 5,997,997 A | | 12/1999 | Angelopoulos et al. |
| 6,221,440 B1 | | 4/2001 | Meyer et al. |
| 6,271,060 B1 | | 8/2001 | Zandman et al. |
| 6,277,669 B1 | | 8/2001 | Kung et al. |
| 6,287,894 B1 | | 9/2001 | Sawin |
| 6,319,554 B1 | | 11/2001 | Natarajan et al. |
| 6,348,240 B1 | | 2/2002 | Calvert et al. |
| 6,528,409 B1 | * | 3/2003 | Lopatin et al. ............. 438/618 |
| 2002/0036143 A1 | * | 3/2002 | Segawa et al. ............. 205/187 |
| 2003/0132766 A1 | * | 7/2003 | Seshan et al. ............. 324/715 |
| 2003/0235658 A1 | * | 12/2003 | Shacham-diamand et al. ... 427/437 |

OTHER PUBLICATIONS

Article—*Electrochemically Deposited Thin Film Alloys For ULSI and MEMS Applications*, Microelectronic Engineering, 50, 2000, pp. 525–531 b7 Y. Shacham–Diamand and Y. Sverdlov.

\* cited by examiner

Primary Examiner—Michael Barr
(74) Attorney, Agent, or Firm—Dority & Manning, P.A.

(57) ABSTRACT

Electroless plating solutions are disclosed for forming metal alloys, such as cobalt-tungsten alloys. In accordance with the present invention, the electroless plating solutions may be formulated so as not to contain any alkali metals. Further, the solutions can be formulated without the use of tetramethylammonium hydroxide. In a further embodiment, a plating solution can be formulated that does not require the use of a catalyst, such as a palladium catalyst prior to depositing the metal alloy on a substrate.

18 Claims, No Drawings

ELECTROLESS PLATING SOLUTION AND PROCESS

BACKGROUND OF THE INVENTION

Electroless plating refers to the autocatalytic or chemical reduction of aqueous metal ions to metal atoms on a substrate without application of an electrical current. Electroless plating processes and compositions are found in a wide variety of commercial practices and are used for plating a substantial number of metals and alloys onto various substrates. Examples of materials commonly plated through this process can include copper, nickel, gold, cobalt, tin-lead alloys, etc. The substrate surface can be any surface that is either catalytically active itself or can be activated by a catalyst. Possible substrates common in the past include, for example, metal, diamond, and a variety of polymers Plating processes can be either selective, i.e., only a portion of the substrate surface is catalytically activated to control precisely where metal deposition will occur, or alternatively can be used to coat an entire substrate surface.

Electroless plating has been widely used in the microelectronics industry for deposition of layers on semiconductor wafers. For example, electroless plating has been used in the past to form adhesion, barrier and capping layers on substrates. For the purposes of this disclosure, a barrier layer is defined as a layer formed on at least a portion of a substrate surface which can prevent contact between the materials located on either side of the barrier layer. For example, a barrier layer can prevent oxidation or otherwise render passive the material covered by the barrier layer, or alternatively can prevent the material contained in a layer located on one side of the barrier layer from diffusing into a layer located on the other side of the barrier layer.

Electroless plating processes known in the past generally include heating a bath solution to a certain deposition temperature, which generally corresponds to at least the minimum deposition temperature (i.e. the minimum temperature where deposition from that bath to that substrate can occur). After heating, the bath solution is pumped into a plating chamber. In the plating chamber, a substrate having an activated surface is present and the electroless plating begins at or near the time the hot solution contacts the substrate.

The plating process itself includes an induction period followed by a steady-state deposition period. The induction period is the time necessary to reach the mixed potential at which the steady-state metal deposition occurs. The deposition is usually designed to occur in a certain pH and temperature range.

One particular example of layers that have been formed using electroless plating are cobalt-tungsten-phosphorous (CoWP) films. Such films have proven to be an effective diffusion barrier for copper metalization, a capping layer to prevent copper from oxidation and have also shown to improve adhesion of the inlaid copper layer to an upper dielectric layer.

In the past, in order to form a CoWP layer on copper, the conventional process included two steps and two separate solutions. In the first step, the substrate being coated was placed in a palladium salt solution causing palladium to deposit on the copper according to a replacement reaction. In the second step, the palladium treated copper layer was then contacted with a second solution causing a CoWP alloy to form a layer on the substrate. The second solution normally contained sodium tungstate as the tungsten ion source, and potassium hydroxide or sodium hydroxide as a pH-adjusting agent. The palladium acted as a catalyst to initiate deposition of the CoWP alloy.

Unfortunately, the alkali metal ions (potassium or sodium) present in the second solution may act as main mobile ionic contaminants. In particular, the metallic ions can move inside the device, causing the device to fail.

In view of the above-described drawbacks of conventional electroless plating solutions, those skilled in the art have attempted to develop alkali metal-free solutions for forming electroless deposited CoWP layers. Although some alkali metal-free solutions have been developed, the solutions typically contain tetramethylammonium hydroxide (TMAH) as a strong alkaline source. TMAH, however, is very expensive dramatically increasing the cost of the electroless plating solution.

In view of the above, a need currently exists for an electroless plating solution that is alkali metal-free and economical to produce. More particularly, a need exists for an electroless plating solution capable of forming cobalt-tungsten alloys that is alkali metal-free and does not contain TMAH. A need also exists for an electroless plating solution that can deposit a cobalt-tungsten alloy layer on a substrate, such as a micro-electronic device, in a single step without having to first contact the substrate with a catalyst, such as a palladium salt.

SUMMARY OF THE INVENTION

In general, the present invention is directed to electroless plating solutions and to processes for using the solutions. The electroless plating solutions of the present invention are alkali metal-free. Further, in one embodiment, the solution can be free of tetramethylammonium hydroxide. In addition, in other embodiments, the solution can deposit an alloy layer on a substrate without first having to treat the substrate with a catalyst, such as a palladium salt.

For example, in one embodiment, the present invention is directed to an electroless plating process for forming a layer in a micro-electronic device. The process includes the steps of first providing an electroless plating solution comprising a reducing agent, a cobalt source, and a tungsten source. According to the present invention, the reducing agent comprises a borane-dimethylamine complex (DMAB).

The above electroless plating solution is contacted with a substrate to form a deposit on the substrate by electroless deposition. The deposit is a cobalt-tungsten alloy, such as a cobalt-tungsten-boron alloy or a cobalt-tungsten-phosphorous-boron alloy.

In addition to the above ingredients, the electroless plating solution can also contain a pH adjusting agent, a buffer, a complexing agent, a stabilizer, and one or more surfactants. Examples of pH stabilizers can include an amine, an ammonium hydroxide, or a hydroxy amine.

The buffer, on the other hand, can be boric acid or an ammonium salt. The complexing agent may be an amino acid, a hydroxy acid, or an ammonium salt thereof.

The cobalt source contained within the solution can be cobalt sulfate, cobalt chloride, or cobalt hydroxide. The tungsten source can be tungstic acid, tungsten oxide, ammonium tungstate, or phosphorous tungsten acid.

In this embodiment, the solution may be alkali metal-free, can contain no tetramethylammonium hydroxide, and can be used to form a cobalt-tungsten layer on a substrate without having to first contact the substrate with a catalyst, such as a palladium catalyst.

In another embodiment of the present invention, the electroless plating solution can include a reducing agent, a pH-adjusting agent, a cobalt source, and a tungsten source. In this embodiment, the reducing agent can be a hypophosphorous acid or an ammonium hypophosphite. Again, the electroless plating solution can be alkali metal-free and can contain no tetramethylammonium hydroxide.

In this embodiment, a cobalt-tungsten alloy layer can be formed with or without palladium activation. In order to eliminate the use of a palladium catalyst, the electroless plating solution can further contain a second reducing agent comprising a borane-dimethylamine complex.

In addition to forming cobalt-tungsten alloy layers, nickel-tungsten alloy layers, cobalt-rhenium alloy layers, and nickel-rhenium alloy layers may also be formed. For instance, when forming a nickel-tungsten alloy layer, the above cobalt source can be replaced with a nickel source. Examples of nickel sources include nickel hydroxide and various soluble nickel salts such as nickel sulfate, nickel chloride, and the like.

When forming a cobalt-rhenium alloy layer, the above-described tungsten source can be replaced with a rhenium source. Examples of rhenium sources include rhenium (VII) oxide, perrhenic acid, ammonium perrhenate, and the like.

In still another embodiment of the present invention, the above-described nickel sources and rhenium sources can be used to form nickel-rhenium alloy layers.

The above alloy layers can be formed on various substrates, such as on copper or on a low K dielectric material.

Other features and aspects of the present invention are discussed in greater detail below.

DETAILED DESCRIPTION

It is to be understood by one of ordinary skill in the art that the present discussion is a description of exemplary embodiments only, and it is not intended as limiting the broader aspects of the present invention.

Electroless plating provides a method of forming a layer on at least a portion of a substrate surface without the application of an electrical current. The present invention provides an electroless plating method and plating solution that is capable of forming alloy films economically and without the presence of known contaminants and impurities. For instance, electroless plating solutions for producing alloy layers can be formulated according to the present invention that are alkali metal-free. Further, the solutions can be made alkali metal-free without having to resort to the use of expensive alkaline materials, such as tetramethylammonium hydroxide.

In one particular embodiment of the present invention, electroless plating solutions can be formulated that are capable of producing cobalt-tungsten alloy layers, nickel-tungsten alloy layers, nickel-rhenium alloy layers, and cobalt-rhenium alloy layers on metal surfaces, such as copper surfaces, or on low K dielectric surfaces without having to use a catalyst, such as a palladium catalyst. By eliminating the requirement of having to use a catalyst, the process for forming the alloy layers becomes simplified, further reducing cost and complexity.

Ultimately, the process of the present invention is capable of producing alloy films, such as cobalt-tungsten-phosphorous films, cobalt-tungsten-phosphorous-boron films, cobalt-tungsten-boron films, nickel-tungsten-phosphorous films, nickel-tungsten-boron films, nickel-tungsten-phosphorous-boron films, cobalt-rhenium-phosphorous films, cobalt-rhenium-boron films, cobalt-rhenium-phosphorous-boron films, nickel-rhenium-phosphorous films, nickel-rhenium-phosphorous-boron films, and nickel-rhenium-boron-films at a relatively low cost. Further, the formed films may have improved metallurgical characteristics due to the absence of various species that were required in many prior art processes.

The electroless plating solutions of the present invention can be used in various applications, such as the formation of adhesion, barrier, and capping layers on semiconductor wafers. For instance, an alloy layer can be plated on top of a previously formed copper layer on a substrate to prevent the oxidation of copper or can be formed on a low K dielectric material. Alternatively, the alloy layer can be a barrier layer to prevent ions from one layer, such as a subsequently formed layer, from diffusing down into layers below the barrier layer. The alloy layers of the present invention are also effective in improving adhesion between a copper layer and an upper dielectric layer.

The electroless plating solutions of the present invention include a first metal source, a second metal source, and at least one reducing agent. For example, in one embodiment, the first metal source can be a cobalt metal source and the second metal source can be a tungsten metal source or a rhenium metal source. Alternatively, the first metal source can be a nickel metal source and the second metal source can be a tungsten metal source or a rhenium metal source. In this manner, cobalt-tungsten alloy layers, nickel-tungsten alloy layers, nickel-rhenium alloy layers, and cobalt-rhenium alloy layers may be formed. In addition to the above ingredients, the electroless plating solution can further include a pH adjusting agent, a complexing agent, a buffer, a surfactant, and/or a stabilizer.

When forming cobalt-tungsten alloys according to the present invention, any suitable cobalt source or tungsten source may be used in the plating solution. Examples of cobalt sources include various cobalt salts, such as cobalt sulfate, cobalt chloride, and/or cobalt hydroxide. Suitable tungsten sources include tungstic acid, tungsten oxide, ammonium tungstate, and/or phosphorous tungsten acid.

When forming alloy layers containing nickel, the nickel source used in the plating solution may be nickel hydroxide and soluble nickel salts, such as nickel sulfate and nickel chloride.

When forming alloy layers containing rhenium, the rhenium source included in the plating solution can be rhenium (VII) oxide, perrhenic acid, ammonium perrhenate, and the like.

The reducing agents that are selected for use with the above metal sources can vary according to the present invention depending upon the particular application and the desired result. In one particular embodiment, for instance, the reducing agent used according to the present invention is a borane-dimethylamine complex (DMAB). When using DMAB as a reducing agent, the present inventors have discovered that various benefits and advantages can be realized. For instance, of particular significance, the present inventors have discovered that when using DMAB as a reducing agent, no catalyst, such as a palladium catalyst, is needed in order to deposit a cobalt-tungsten alloy layer on a substrate, such as a copper coated substrate.

Specifically, electroless metal deposition is a process of autocatalytic nucleation and growth, and typically needs a catalyst to initiate the reaction. For instance, copper is not considered a catalytic substrate for electroless deposition.

Consequently, in the past, copper surfaces where typically catalyzed with a palladium catalyst prior to deposition of an alloy layer, such as a cobalt-tungsten alloy layer.

The palladium catalyst used in the past was typically a palladium salt, such as palladium sulfate or palladium chloride. A copper coated substrate was typically immersed into a solution containing the palladium salt causing the following reaction to occur:

$$Cu+Pd^{2+} \rightarrow Cu^{2+}+Pd$$

Once the above replacement reaction occurs, the palladium now present on the substrate allows for cobalt nucleation to occur. Once cobalt nucleation begins, tungsten becomes co-deposited on the surface since cobalt acts as a catalytic metal also.

The present inventors have discovered, however, that when using DMAB as a reducing agent, palladium activation is not needed. Although unknown, it is believed that DMAB lowers the activation energy needed for depositing cobalt or other materials on copper. This result provides various advantages and benefits.

For instance, by not requiring a palladium catalyst, the process for depositing the alloy layer on a substrate becomes simplified. At least one step in the process for depositing the layer is completely eliminated. Further, it is believed that by depositing an alloy layer on a substrate without palladium activation increases the reliability and performance of the layer that is formed. For example, it is believe that palladium is likely to increase the resistance of copper and can be considered an impurity in the resulting device.

When using DMAB as a reducing agent, the resulting alloy layer will contain at least trace amounts of boron. Thus, when using DMAB, cobalt-tungsten-boron layers, nickel-tungsten-boron layers, nickel-rhenium-boron layers, or cobalt-rhenium-boron layers can be made and deposited on substrates.

In another embodiment of the present invention, instead of using DMAB as a reducing agent, hypophosphorous acid or ammonium hypophosphite may be used as a reducing agent. Hypophosphorous acid or ammonium hypophosphite can be used as reducing agents in an embodiment of the present invention in which the electroless plating solution is alkali metal-free. Specifically, the present inventors have discovered that hypophosphorous acid or ammonium hypophosphite work well in conjunction with particular pH stabilizers that do not contain an alkali metal. In this embodiment, palladium catalysts may be used in constructing the alloy layer.

When using hypophosphorous acid or ammonium hypophosphite as the reducing agent, the resulting alloy layer will generally contain phosphorous. Thus, hypophosphorous acid or ammonium hypophosphite can be used to form cobalt-tungsten-phosphorous films, nickel-tungsten-phosphorous films, nickel-rhenium-phosphorous films, or cobalt-rhenium-phosphorous films. Such films may be desired in some particular applications.

In still another embodiment of the present invention, the electroless plating solution can include a combination of reducing agents. Specifically, DMAB can be combined with hypophosphorous acid or ammonium hypophosphite. In this embodiment, cobalt-tungsten-phosphorous-boron layers, nickel-tungsten-phosphorous-boron layers, nickel-rhenium-phosphorous-boron layers, or cobalt-rhenium-phosphorous-boron layers can be produced. The electroless plating solution can be formulated to be alkali metal-free by selecting particular pH stabilizers. Further, the alloy layer can be formed without the use of a plating catalyst due to the presence of DMAB.

As described above, in addition to the metal sources and one or more reducing agents, the electroless plating solution of the present invention can contain a pH adjusting agent, a complexing agent, a buffer, a surfactant, and a stabilizer. For many applications, preferably a pH stabilizer is selected that does not contain or contribute any alkali metal ions to the plating solution. Particular pH adjusting agents that have been found to be well suited for use in the present invention include ammonium hydroxide, an amine, a hydroxy amine or mixtures thereof. For example, particular hydroxy amines that can be used in the present invention include monoethanolamine or ethylenediamine. The above pH-adjusting agents have been found to work well with DMAB, hypophosphorous acid, or ammonium hypophosphite. Of particular advantage, all of the above-identified pH-adjusting agents are relatively inexpensive. Further, the above pH-adjusting agents can be used without having to resort to more expensive components, such as tetramethylammonium hydroxide.

In general, the pH-adjusting agent is added to the solution in order to increase the pH of the solution. In general, the pH-adjusting agent can be added to the solution in order for the solution to have a pH of from about 7.5 to about 11.0.

A complexing agent refers to a substance contained in the electroless plating solution that is capable of forming a complex compound with another material in the solution. When present in the electroless plating solution of the present invention, the complexing agent complexes with metal ions to make the solution more stable.

Complexing agents that may be used in accordance with the present invention include amino acids, hydroxy acids, or their ammonium salts. Other complexing agents that may be used include pyrophosphate salts, pyrophosphoric acid, and ammonium salts of pyrophosphoric acid. Particular examples include succinic acid, malic acid, glycine, tartaric acid, citric acid, or their ammonium salts. Similar to the pH-adjusting agent, preferably a complexing agent when present in the solution does not contribute any alkali metal ions. In one particular embodiment, a citric acid-ammonium hydroxide complexing agent is present in the plating solution.

As used in the present invention, a buffer can be added to the electroless plating solution in order to maintain the pH of the solution within a desired range. Buffer agents that can be used in accordance with the present invention include boric acid, ammonium salts, and mixtures thereof. Particular examples of buffers include ammonium sulfate, ammonium chloride, and ammonium acetate. In one embodiment, when a complexing agent comprising a combination of citric acid and ammonium hydroxide is present in the plating solution, an ammonium salt may be used as a buffer. The present inventors have discovered that this particular combination provides good surface structure and proper film composition. Further, ammonium salts not only act as buffers, but also have some complexing function.

In addition to the above ingredients, the electroless plating solution of the present invention can further include one or more surfactants and one or more stabilizers. Any suitable surfactant can be chosen for use in the present invention as long as the surfactant does not adversely interfere with the plating process. In many applications, surfactants may not be needed. In one embodiment, however, one particular surfactant that may be used in accordance with the present invention is RE-610 surfactant available from the Rhodia Corporation.

The use of a stabilizer in the present invention is also optional. Stabilizers that can be used in the present invention include organic sulfurous compounds. Particular examples of stabilizers include thiourea and benzosulfimide.

The amount each ingredient is present in the electroless plating solution can depend upon the particular application. For exemplary purposes only and without limiting the present invention, the following are relative amounts of each ingredient that can be present in the plating solution:

| | |
|---|---|
| Cobalt or Nickel Source | 0.05 to 0.1 mol/l |
| Tungsten or Rhenium Source | 0.01 to 0.05 mol/l |
| Hypophosphorous Acid or Ammonium Hypophosphite Reducing Agent | 0.1 to 0.4 mol/l |
| DMAB Reducing Agent | 0.01 to 0.1 mol/l |
| Complexing Agent | 0.1 to 0.6 mol/l |
| Buffer | 0.1 to 0.5 mol/l |
| pH Adjusting Agent | so pH is from 7.5 to 11.0 |

In order to form alloy films in accordance with the present invention, in general, conventional equipment and processes can be used to carry out the deposition. In one embodiment, for instance, when forming a cobalt-tungsten alloy layer without the use of a palladium catalyst, the process first includes the step of cleaning a substrate using any suitable cleaner. The cleaner can be, for instance, a suitable oxidizer. After being cleaned, the substrate can be rinsed in distilled water and then cleaned again using, for instance, a weak acid. After the acid wash, the substrate can be once again rinsed in distilled water and contacted with the electroless plating solution of the present invention. The electroless plating solution can have a pH from about 7.5 to about 11.0 and be at a temperature of from about 50° C. to about 95° C.

After the plating process is completed, the plated substrate can then be rinsed in distilled water and dried for subsequent processing.

In other embodiments of the present invention, when the use of a palladium catalyst is desired, the substrate after being washed with acid can be contacted with a solution containing a palladium salt. Once an appropriate amount of palladium is deposited on the substrate, the substrate can then be rinsed in distilled water, contacted with the cleaning solution, and then rinsed again in distilled water.

For exemplary purposes only, the following are six different electroless plating solutions made according to the present invention:

Electroless Plating Solution 1

$Co(OH)_2$: 0.05 to 0.1 mol/l
$H_2WO_4$: 0.01 to 0.05 mol/l
$C_6H_8O_7$: 0.1 to 0.6 mol/l
$H_3BO_3$: 0.1 to 0.5 mol/l
$NH_4OH(25\%)$: 10 to 100 ml
DMAB: 0.01 to 0.1 mol/l
$(NH_4)H_2PO_2$: 0.1 to 0.4 mol/l
RE-610 Surfactant: 0.05 g/l
pH=7.5 to 11.0
Result: CoWP and trace B alloy.

Electroless Plating Solution 2

$Co(OH)_2$: 0.05 to 0.1 mol/l
$H_2WO_4$: 0.01 to 0.05 mol/l
$C_6H_8O_7$: 0.1 to 0.6 mol/l
$NH_4OH(25\%)$: 10 to 100 ml
$(NH_4)_2SO_4$: 0.1 to 0.5 mol/l
DMAB: 0.01 to 0.1 mol/l
$(NH_4)H_2PO_2$: 0.1 to 0.4 mol/l
RE-610 Surfactant: 0.05 g/l
pH=7.5 to 11.0
Result: CoWP and trace B alloy.

Electroless Plating Solution 3

$Co(OH)_2$: 0.05 to 0.1 mol/l
$H_2WO_4$: 0.01 to 0.015 mol/l
$C_6H_8O_7$: 0.1 to 0.6 mol/l
$H_3BO_3$: 0.1 to 0.5 mol/l
$NH_4OH(25\%)$: 10 to 100 ml
$(NH_4)H_2PO_2$: 0.1 to 0.4 mol/l
RE-610 Surfactant: 0.05 g/l
pH=7.5 to 11.0
Result: CoWP alloy.

Electroless Plating Solution 4

$Co(OH)_2$: 0.05 to 0.1 mol/l
$H_2WO_4$: 0.01 to 0.05 mol/l
$C_6H_8O_7$: 0.1 to 0.6 mol/l
$NH_4OH(25\%)$: 10 to 100 ml
$(NH_4)H_2PO_2$: 0.1 to 0.4 mol/l
$(NH_4)_2SO_4$: 0.1 to 0.5 mol/l
RE-610 Surfactant: 0.05 g/l
pH=7.5 to 11.0
Result: CoWP alloy.

Electroless Plating Solution 5

$Co(OH)_2$: 0.05 to 0.1 mol/l
$H_2WO_4$: 0.01 to 0.05 mol/l
$C_6H_8O_7$: 0.1 to 0.6 mol/l
$H_3BO_3$: 0.1 to 0.5 mol/l
$NH_4OH(25\%)$: 10 to 100 ml
DMAB: 0.01 to 0.1 mol/l
RE-610 Surfactant: 0.05 g/l
pH=7.5 to 11.0
Result: CoWB alloy.

Electroless Plating Solution 6

$Co(OH)_2$: 0.05 to 0.1 mol/l
$H_2WO_4$: 0.01 to 0.05 mol/l
$C_6H_8O_7$: 0.1 to 0.6 mol/l
$(NH_4)_2SO_4$: 0.1 to 0.5 mol/l
$NH_4OH(25\%)$: 10 to 100 ml
DMAB: 0.01 to 0.1 mol/l
RE-610 Surfactant: 0.05 g/l
pH=7.5 to 11.0
Result: CoWB alloy.

As shown above, all of the exemplary electroless plating solutions are alkali metal-free. Further, for any of the above plating solutions that contain DMAB, a palladium catalyst is not required.

These an other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and it not intended to limit the invention so further described in such appended claims.

What is claimed is:

1. An electroless plating process for forming a layer in a micro-electronic device comprising:

providing an electroless plating solution comprising a first reducing agent, a second reducing agent, a pH adjusting agent, a first metal source, and a second metal source, the first reducing agent comprising a hypophosphorous acid or an ammonium hypophosphite, the second reducing agent comprising a borane-dimethylamine complex, the first reducing agent being present in the solution in an amount from about 0.1 to about 0.4 mol/l and the second reducing agent being present in the solution in an amount from about 0.01 to about 0.1 mol/l, the electroless plating solution being alkali metal-free and containing no tetramethylammonium hydroxide; and contacting a substrate with the electroless plating solution to form a deposit on the substrate by electroless deposition, the deposit comprising a first metal-second metal alloy and wherein the deposit is formed on the substrate without first contacting the substrate with a catalyst.

2. A process as defined in claim 1, wherein the alloy comprises a cobalt-tungsten-phosphorous alloy, cobalt-tungsten-phosphorous-boron alloy, nickel-tungsten-phosphorous alloy, nickel-tungsten-phosphorouiboron alloy, cobalt-rhenium-phosphorous alloy, cobalt-rhenium-phosphorous-boron alloy, nickel-rhenium-phosphorous alloy, or nickel-rhenium-phosphorous-boron alloy.

3. A process as defined in claim 1, wherein the electroless plating solution further comprises a buffer.

4. A process as defined in claim 1, wherein the electroless plating solution further comprises a complexing agent.

5. A process as defined in claim 1, wherein the pH-adjusting agent comprises an amine, an ammonium hydroxide, or a hydroxy amine.

6. A process as defined in claim 5, wherein the pH-adjusting agent comprises monoethanolamine or ethylenediamine.

7. A process as defined in claim 3, wherein the buffer comprises boric acid or an ammonium salt.

8. A process as defined in claim 7, wherein the buffer comprises ammonium sulfate, ammonium chloride, or ammonium acetate.

9. A process as defined in claim 4, wherein complexing agent comprises an amino acid, a hydroxy acid, a pyrophosphoric acid, or an ammonium salt thereof.

10. A process as defined in claim 9, wherein the complexing agent comprises succinic acid, malic acid, glycine, tartaric acid, citric acid, or an ammonium salt thereof.

11. A process as defined in claim 1, wherein the first metal source comprises cobalt sulfate, cobalt chloride, or cobalt hydroxide, and the second metal source comprises tungstic acid, tungsten oxide, ammonium tungstate, or phosphorous tungsten acid.

12. A process as defined in claim 1, wherein the electroless plating solution has a pH of from about 7.5 to about 11.0 and has a temperature of from about 50° C. to about 95° C. when contacted with the substrate.

13. A process as defined in claim 1, wherein the alloy is formed on a copper layer on the substrate.

14. A process as defined in claim 1, wherein the first metal source is present within the electroless plating solution in an amount from about 0.05 to about 0.1 mol/l, and the second metal source is present in the electroless plating solution in an amount from about 0.01 to about 0.05 mol/l.

15. A process as defined in claim 1, wherein the first metal source comprises cobalt sulfate, cobalt chloride, or cobalt hydroxide and the second metal source comprises rhenium (VII) oxide, perrhenic acid, or ammonium perrhenate.

16. A process as defined in claim 1, wherein the first metal source comprises nickel hydroxide or a soluble nickel salt and the second metal source comprises tungstic acid, tungsten oxide, ammonium tungstate, or phosphorous tungsten acid.

17. A process as defined in claim 1, wherein the electroless plating solution further comprises a surfactant.

18. A process as defined in claim 1, wherein the electroless plating solution further comprises a stabilizer, the stabilizer comprising an organic sulfurous compound.

* * * * *

UNITED STATES PATENT AND TRADEMARK OFFICE
CERTIFICATE OF CORRECTION

PATENT NO.     : 6,797,312 B2
DATED          : September 28, 2004
INVENTOR(S)    : Kong et al.

It is certified that error appears in the above-identified patent and that said Letters Patent is hereby corrected as shown below:

Column 9,
Line 32, the words "nickel-tungsten-phosphorouiboron" should read -- nickel-tungsten-phosphorous-boron --.

Signed and Sealed this

Twenty-third Day of August, 2005

JON W. DUDAS
*Director of the United States Patent and Trademark Office*